United States Patent [19]

Sakurai et al.

[11] Patent Number: 5,384,956
[45] Date of Patent: Jan. 31, 1995

[54] METHOD FOR MOUNTING COMPONENTS

[75] Inventors: Hiroshi Sakurai; Hitoshi Onodera; Hiroyuki Ohta, all of Iwata, Japan

[73] Assignee: Yamaha Hatsudoki Kabushiki Kaisha, Iwata, Japan

[21] Appl. No.: 73,741

[22] Filed: Jun. 8, 1993

[30] Foreign Application Priority Data

Jul. 1, 1992 [JP] Japan .................................. 4-173571

[51] Int. Cl.⁶ .............................................. H05K 3/30
[52] U.S. Cl. ...................................... 29/834; 29/709; 29/740; 29/833
[58] Field of Search ................. 29/709, 407, 834, 832, 29/833, 740

[56] References Cited

U.S. PATENT DOCUMENTS

| | | |
|---|---|---|
| 3,337,941 | 5/1967 | Drop . |
| 3,487,226 | 10/1969 | Yetter et al. . |
| 3,622,396 | 11/1971 | Fernandez . |
| 3,624,401 | 11/1971 | Stoller . |
| 3,876,877 | 4/1975 | Meulensteen et al. . |
| 4,092,719 | 5/1978 | Salmon . |
| 4,144,449 | 3/1979 | Funk et al. . |
| 4,151,945 | 5/1979 | Regard et al. . |
| 4,247,767 | 1/1981 | O'Brien et al. . |
| 4,346,293 | 8/1982 | Fetzer . |
| 4,383,359 | 5/1983 | Suzuki et al. . |
| 4,615,093 | 10/1986 | Tews et al. ................. 29/709 X |
| 4,790,069 | 12/1988 | Maruyama et al. ................. 29/709 X |
| 4,805,110 | 2/1989 | Takahashi et al. ................. 29/709 X |
| 5,060,366 | 10/1991 | Asai et al. ................. 29/709 X |

FOREIGN PATENT DOCUMENTS

| | | |
|---|---|---|
| 0416878 | 3/1991 | European Pat. Off. . |
| 0471272 | 2/1992 | European Pat. Off. . |
| 2834836 | 6/1979 | Germany . |
| 9214988 | 9/1992 | WIPO . |

Primary Examiner—Carl J. Arbes
Attorney, Agent, or Firm—Knobbe, Martens, Olson & Bear

[57] ABSTRACT

A component mounting device including a measuring station where the length of the component is measured in two different angular positions so as to permit calculation of the corrective factors necessary by the displacement of the point of pick up of the component by the gripping device from its center so as to permit accurate positioning of the component on a substrate. The device operates to begin movement of the component toward its mounted position before the measuring has commenced.

22 Claims, 10 Drawing Sheets 5,384,956

1

METHOD FOR MOUNTING COMPONENTS

BACKGROUND OF THE INVENTION

This invention relates to a method and apparatus for mounting components and more particularly to an improved method and apparatus for determining the amount of correction that should be made to compensate for the way in which the component is picked up.

A wide variety of apparatus have been proposed for picking up small components such as IC's resistors, condensers or the like and positioning them for mounting on a substrate such as a printed circuit board or the like. In order to permit accurate mounting of the component, the orientation of the component relative to the pick up device once it is picked up must be determined. Normally the components are presented to the pick up device at a station and frequently the components are mounted in recesses on a tape or the like. As such, it is not accurately known what the position of the component is relative to the pick up device when the component is picked up.

Thus, considering the "X", "Y" axes and the rotational position $\theta$ about the axis of the pick up device, it is necessary to measure the correction factors both in the "X" direction, in the "Y" direction and the rotational position of the component relative to the pick up when the component is picked up. Various measuring devices have been proposed for this purpose.

The disadvantage of necessitating separate measurements is that the measurements all take time and, therefore, the previously proposed devices have been relatively slow in operation.

It is, therefore, a principal object to this invention to provide an improved method and apparatus for determining the correction necessary for a component that is picked up by a gripping device so that it can be accurately positioned.

It is a further object to this invention to provide an improved method and apparatus for determining the position of a component that is picked up by a pick up device.

SUMMARY OF THE INVENTION

This invention is adapted to be embodied in a method and apparatus for determining where a component is picked up by a gripping device that is rotatable about an axis so that the component can be accurately placed by the gripping device. In accordance with the method, the projected length of the component in a plane parallel to the axis in a first rotational position is measured. The component is then rotated to a second position wherein the length of its projection on the plane is again measured. The angle of rotation between the positions is measured and the place where the component has been picked up is calculated from the measurements of length projected in the plane and the angle of rotation.

An apparatus of performing this function includes a measuring device that is effective to measure the length of the component in a plane parallel to the axis. Means for rotating the component when picked up is provided so that two different length measurements may be made in the plane at two different angular positions. The position of pick up is then calculated from these measurements.

DETAILED DESCRIPTION OF THE PREFERRED EMBODIMENT OF THE INVENTION

Figure 1:
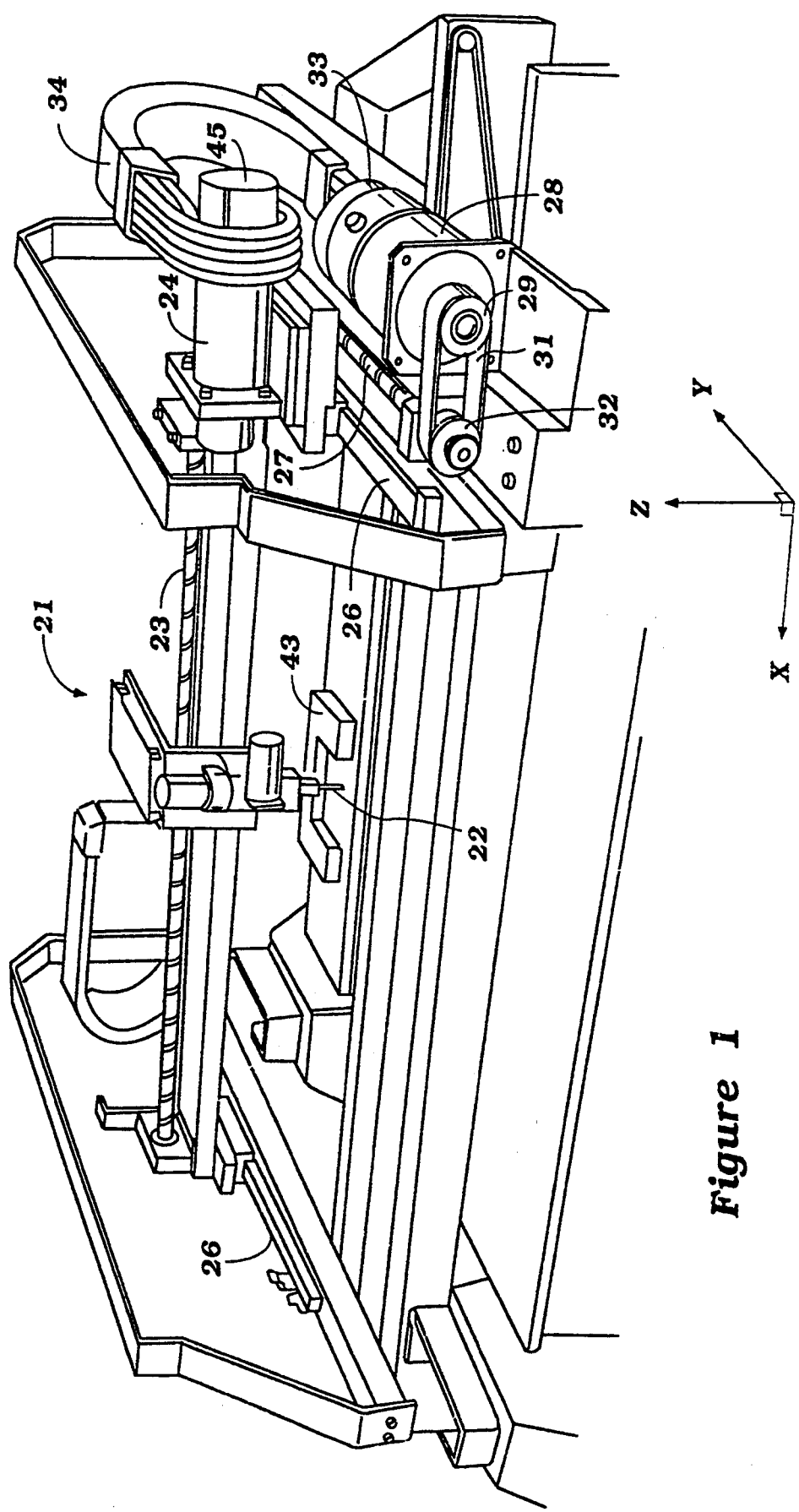
FIG. 1 is a perspective view of a component mounting apparatus constructed and operated in accordance with an embodiment of the invention.
Figure 2:
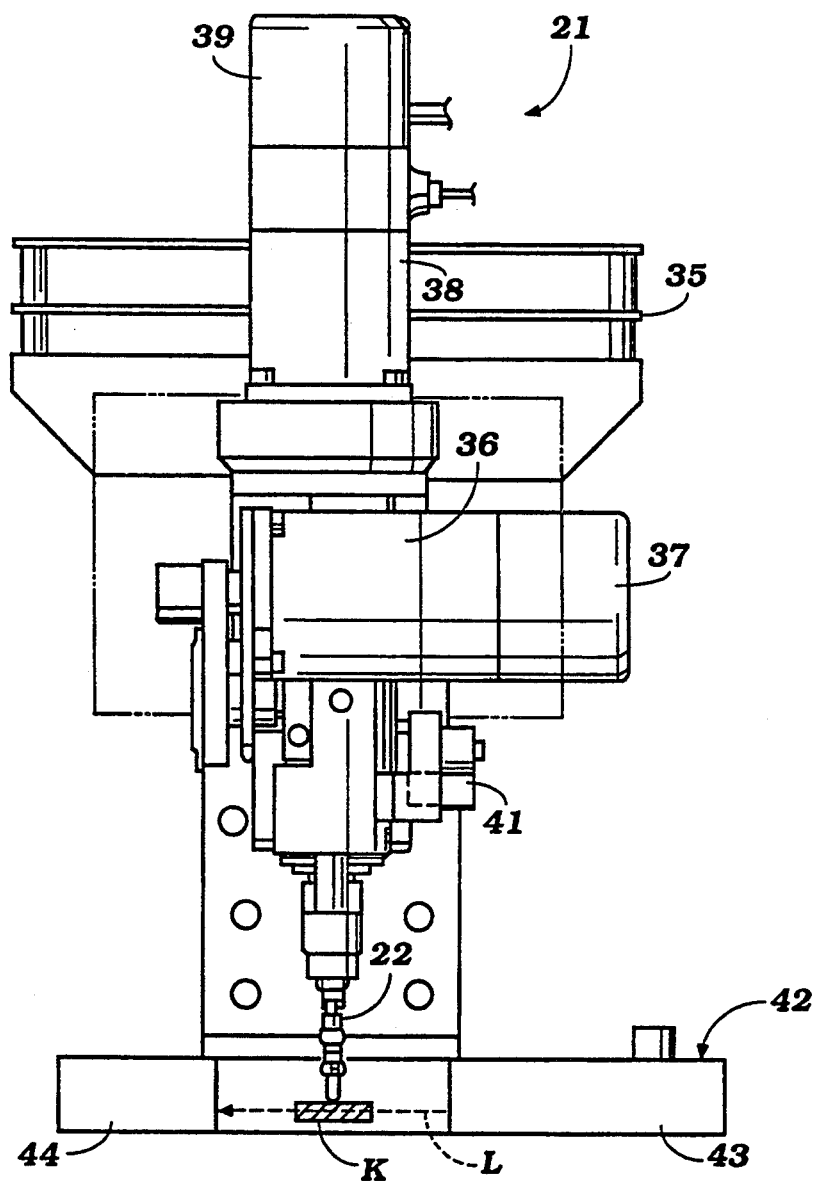
FIG. 2 is an enlarged side elevational view showing the apparatus when a component has been picked up and is positioned in the measuring station.
Figure 3:
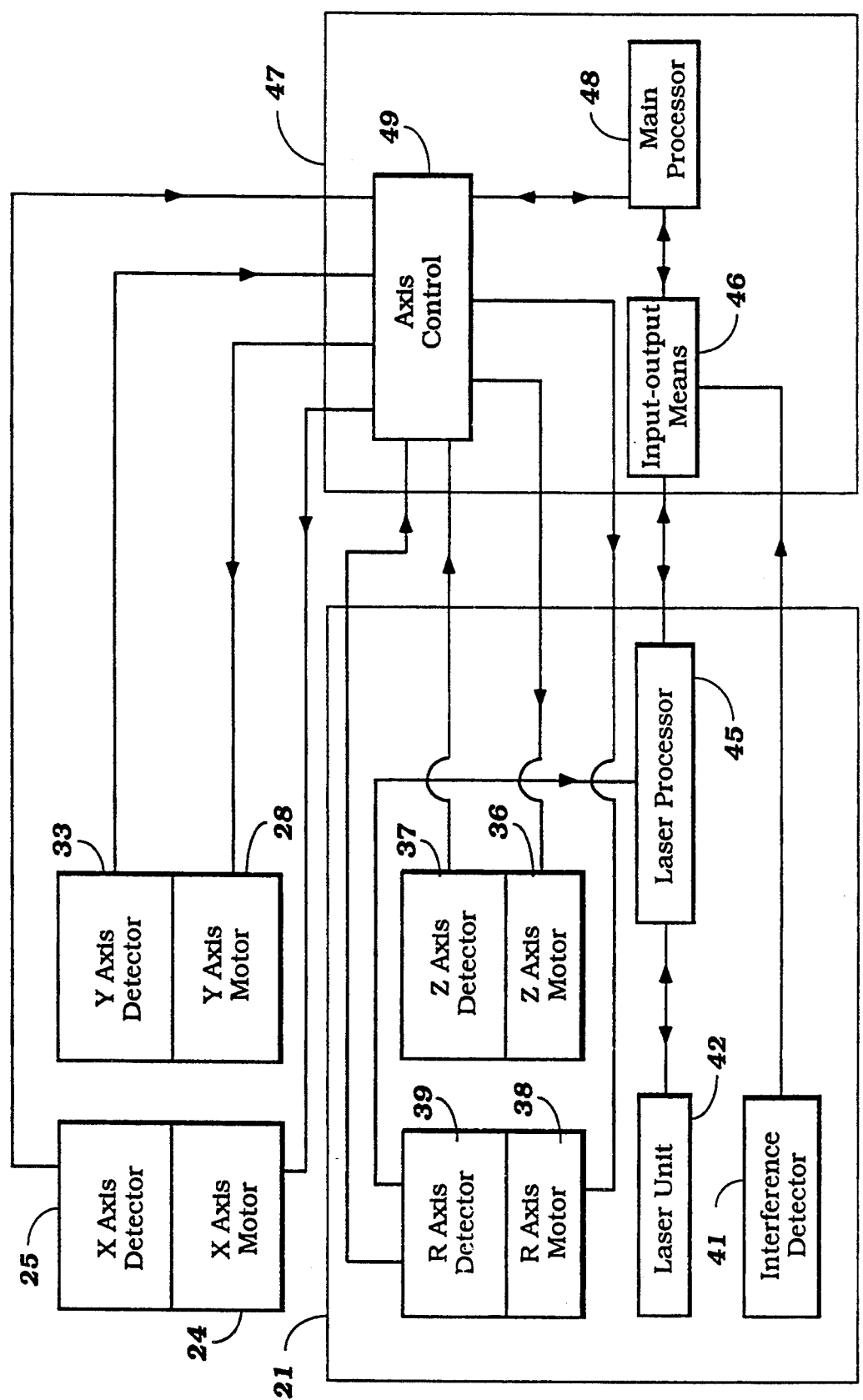
FIG. 3 is a block diagram showing the various components of the apparatus and their interrelationship.

Referring now in detail to the drawings and initially to FIGS. 1 through 3, a component mounting apparatus is comprised of a component pick up head 21 that has a pick up nozzle 22 of the vacuum type for picking up small components to be mounted on a substrate such as a printed circuit board or the like. The pick up head 21 may be of the vacuum type but it is to be understood that this invention can be employed with a wide variety of other types of pick up devices.

The pick up head 21 is supported upon a carriage, to be described, for movement in the "XX" direction along a feed screw 23 which is driven by a servo motor 24. A suitable support for the pick up head 21 is provided for this purpose. A position sensing device such as a encoder 25 is coupled to the servo motor 24 and provides a signal indicative of the position of the pick up head 21 in the "XX" direction.

The "XX" drive and pick up head 21 as thus far described, are moveable as a unit in the "YY" direction along a pair of guide rails 26 that are positioned at the end of the apparatus. A feed screw 27 drives the assemblage comprised of the "XX" drive and pick up head 21 in the "YY" direction. A servo motor 28 has a driving sprocket 29 which drives a belt 31 to drive a driven sprocket 32 affixed to the end of the feed screw 27. Hence, operation of the servo motor 28 and the drive moves the pick up head 21 in the "YY" direction. A position sensor such as a encoder 33 is coupled with the servo motor 28 so as to provide a signal indicative of the "YY" position of the pick up head 21.

A flexible conduit 34 contains the power controls for the servo motor 24 and the drives, to be described, for the pick up head 21 so as to permit the transmission of electrical power to the pick up head 21 when it moves in the "YY" direction.

Referring now in detail primarily to FIGS. 2 and 3, the pick up head 21 includes a carriage 35 on which the pick up nozzle 22 is supported for movement both in an axial direction along the "ZZ" axis and for rotary motion about an axis coincident with the pick up head 22 and identified as the "R" axis.

Movement in the "ZZ" direction is controlled by a servo motor 36 that drives the pick up nozzle 22 between its lowered and raised positions and which is coupled to an encoder or position sensing device 37 so as to determine the location of the pick up nozzle 22 in the "ZZ" direction. Rotary motion about the "R" axis is accomplished by means of a servo motor 38 which is coupled to the pick up nozzle 22 to rotate it about the "R" axis. An encoder 39 is coupled with the servo motor 38 so as to provide a position signal indicative of the angular position $\theta$ about the "R" axis.

Two further sensor mechanisms are carried by the pick up head 21. These include an interference detector 41 which is operative to provide an signal when the pick up nozzle 22 has moved along the "ZZ" direction until a position clear of the where articles have been picked up so as to permit movement of the pick up head 21, as will be described.

As a further sensor, there is a provided an optical measuring device, indicated generally by the reference numeral 42 which includes a laser light source 43 that emits a plurality of parallel light rays as shown in FIG. 2 and in FIGS. 7 through 9 and 11 which are obstructed by the picked up component, indicated at "K" on a photo-detector 44 such as a CCD device along a line "L". As may be seen in FIG. 3, the laser unit 42 is connected to a laser processor 45 that outputs and receives signals from an input/output means 46, for a purpose which will be described.

Referring now specifically to FIG. 3, the system is provided with a main controller, indicated by the reference numeral 47 which includes in addition to the input/output means 46, a main processor 48 that provides the control sequence which will be described. This main processor 48 controls the transmission of signals from the input/output means 46 and the interference detector 41 and also provides access control to an axis controller 49 which will set the various positions of the components, as will now be described.

Figure 4:
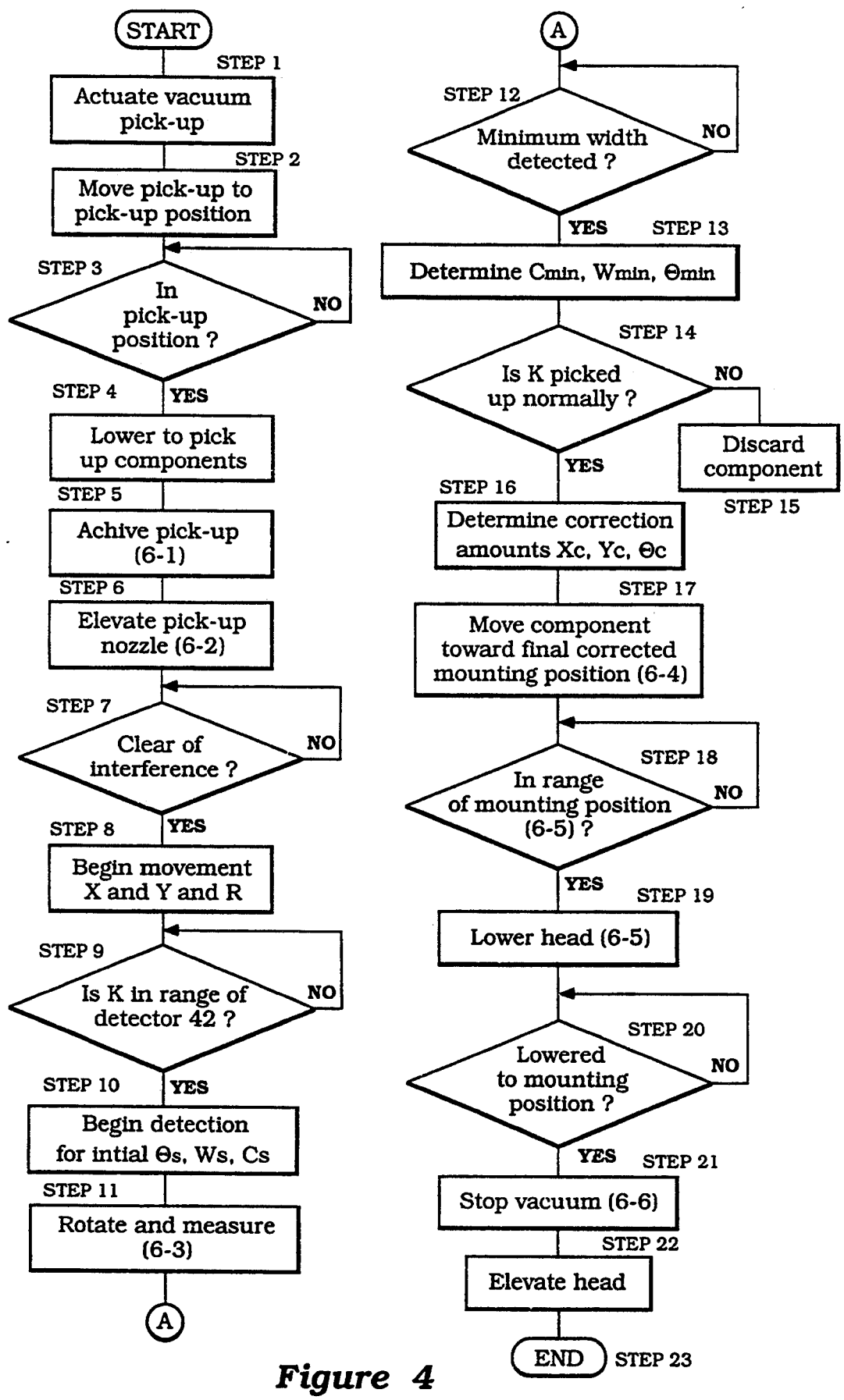
FIG. 4 is a block diagram showing the control routine in accordance with the method and the method by which the apparatus operates.
Figure 5:
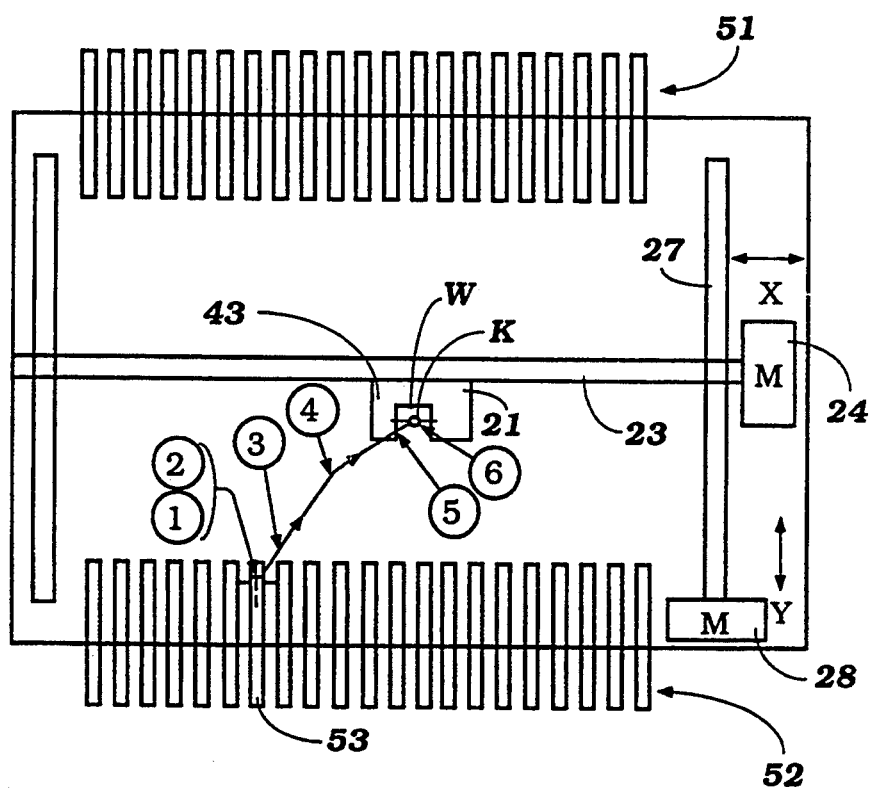
FIG. 5 is a top plan view of the apparatus and shows the path of movement between the picking up of a component at a supply station and the depositing of it in the desired location on a substrate such as a printed circuit board.

The method by which the apparatus operates so as to pick up components and position them appropriately on the substrate will now be described by particular reference to FIGS. 4 through 14. Referring initially to FIG. 5, this is a top plan view and shows the apparatus during a particular pick up and mounting mode. As may be seen on opposite sides of the apparatus, there are provided pairs of feeder stations 51 and 52 where components to be mounted are fed. These feeder stations 51 and 52 may generally be comprised of tape feeders 53 which present small components to be picked up by the pick up head 21 and specifically the pick up nozzle 22, moved to an appropriate position and oriented so as to be mounted on a substrate (not shown) carried on a table between the feeder stations 51 and 52.

It should be noted that the components fed at the stations 51 and 52 although being generally oriented in a certain relationship, are not accurately positioned in the necessary orientation. That is, the components are normally contained in pockets in a tape and although those pockets are sized so as to orient the components "K" in a particular relationship, the components may be at different angular positions about an angle $\theta$ relative to the axis "R" of the pick up nozzle 22 and also displaced along the "X" and "Y" axis from the rotational axis "R" and center of the pick up nozzle 22.

Therefore, the device functions so as to pick up the components from the feeder tapes 33 and first determine the actual orientation of the point of pick up and the component relative to the nozzle. That is, the component may be picked up at an "XY" position that is offset from its center "G" relative to the center "O" of the pick up nozzle 22 for the individual component "K" as clearly shown in FIGS. 7 through 9 and 11. Hence, the device functions to provide certain measurements, as will be hereinafter noted, that permit the orientation to be determined and the necessary corrections made by the apparatus so that the components "K" can be accurately mounted.

This operation will now be described by reference to the block diagram of FIG. 4 and cross-reference to FIGS. 5 and 6 which show the path of travel during the pick up, orientation and mounting positions with the various points in this travel being indicated by the references numerals 1 through 6 in FIG. 5 and the corresponding positions being illustrated in the views of FIG. 6 (6-1 through 6-6). It should be noted that certain of the orders of operation of the steps which will be described by reference to FIG. 4 may be varied. These variations may be made without departing from the basic operation of the system and certain of these possible variations will be described. It is to be understood, however, that other variations may be possible.

When the program starts, it moves to Step 1 which, in accordance with one embodiment, starts the vacuum force to the pick up nozzle 22 so as to place the nozzle 22 in a condition that it will be capable of picking up components. The program then moves to the Step 2 where the axis control 49 is energized by the main processor 48 so as to move the pick up head 21 to a position above and adjacent the appropriate tape feeder 53. This is done by actuating the "X" and "Y" axes motors 24 and 28 so as to position the pick up head 21 in the appropriate location and also by actuating the "R" axis servo motor 38 so as to place the pick up head 21 in the desired rotational position prior to pick up. At the same time, the "Z" axis servo motor 36 will have been previously actuated so as to elevate the pick up nozzle 22 away from interference with the tape feeder 53. It should be readily apparent that the order of operation of the Steps 1 and 2 can be reversed.

The program then at the Step 3 confirms if the pick up head 21 is in the appropriate pick up position. If it is not, the program repeats.

If, however, at the Step 4 it is determined that the pick up head 21 is in a position wherein it is in the allowable range of picking up the components "K", then at the Step 4 the "Z" axis servo motor 36 is actuated so as to lower the pick up nozzle 22 an amount sufficient so that the nozzle 22 can pick up the component "K"

contained in the feeder 53. This condition is also shown in view 1 of FIG. 6 (6-1).

It can be confirmed that the component is picked up by detecting the vacuum at the pick up nozzle 22 and once it is confirmed that the component "K" has been picked up, the "Z" axis servo motor 36 is again energized at the Step 6 so as to elevate the pick up nozzle 22. This initial pick up action is also shown in FIG. 6.

The program then moves to the Step 7 where the interference detector 41 determines if the pick up nozzle 22 has been elevated sufficiently clear from the tape feeder 53 so as to begin movement of the pick up head 21. If the clearance is not reached, the program repeats.

When it is determined that the component "K" picked up by the pick up nozzle 22 is clear of the tape feeder 53, then the main processor 48 again actuates the axis control 49 so as to being movement from the pick up station in the "X" and "Y" directions toward the area where the component "K" will be mounted on the substrate. At the same time, the "R" axis motor 38 is actuated so as to provide an initial degree of rotation $\theta_s$ in a clockwise direction for the picked up component "K" and the pick up nozzle 22. The reason for this will be described later.

The program then moves to the Step 9 so as to determine if the component "K" has been raised sufficiently so as to be in proximity to the detector 42. Once it is determined that the component "K" has been elevated into the detection range as shown in FIG. 6-3, then the detecting operation is begun at the Step 10.

The method of measuring the location of pick up of the component "K" will now be described in addition by reference to FIGS. 7 through 11. As previously noted, the components "K" will be only roughly positioned at the pick up station where the pick up has occurred. Hence, the center of the pick up nozzle "O" will probably be displaced from the center "G" of the component "K". The angular position $\theta$ will also vary about the rotational axis "R".

In order to insure that the component is in a position other than its minimum width position when initially picked up, once pick up has been accomplished, the component is rotated so that it will be rotated clockwise through an angle $\theta_s$ from the initial angular position as determined by an arbitrary line "M" drawn through the center of the nozzle "O" which constitutes the $\theta=0$ position.

Hence, this initial rotation through the angle $\theta_s$ will position the chip "K" in an angle $\theta_s$ so that when the light is emitted from the light source 43 to the light sensitive pick up 44, an area indicated as "$W_s$" which is equal to the width or length of the component "K" in a plane parallel to the "R" axis of the pick up nozzle will be occluded. When this measurement is taken, the center "G" of the component "K" will be displaced at a distance $C_s$ from a line "L" which forms the perimeter at one side of the measurement apparatus.

Figure 8:
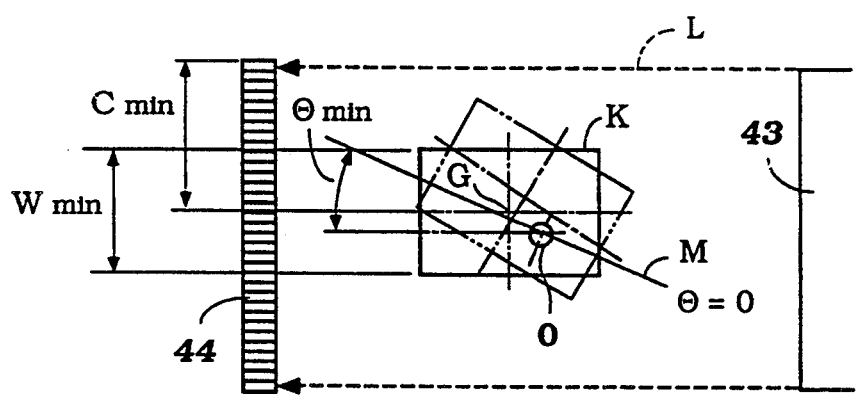
Figure 9:
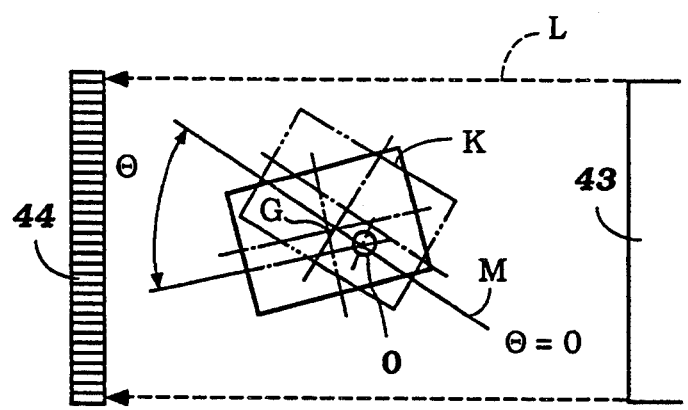

The pick up nozzle 21 is then rotated in a counter clockwise direction from the previous clockwise rotation through a position as shown in FIG. 8 where the minimum projected width $W_{min}$ is illustrated. At this point, it will be possible to determine the location of the center "G" at the mid point of $W_{min}$ and hence at a distance $C_{min}$ from the line "L". The rotation continues until a rotation through the predetermined angle $\theta_e$ has occurred as shown in FIG. 9.

Figure 10:
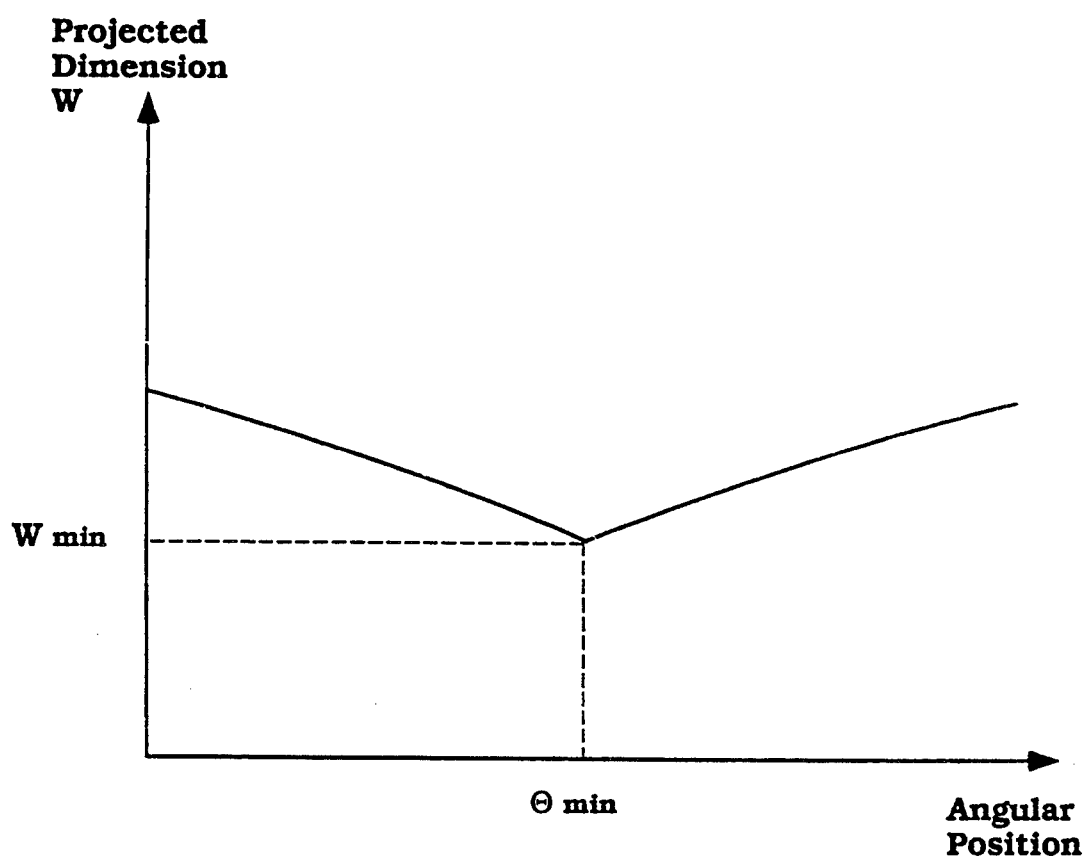
FIG. 10 is a graphical view showing the rotational position in accordance with FIGS. 7 through 9 and the effective projected length on the detector for the various angular positions.

FIG. 10 shows the way in which the projected width will vary with the $\theta_{min}$ position being that where the projected dimension "W" is at its minimum. The specific angle $\theta_e$ does not have to be a large angle and 45° is an appropriate angle so as to insure that the $W_{min}$ condition can be met.

Once the angular measurement necessary to determine the minimum width $\theta_{min}$ from the position $\theta_s$ has been determined and the width at the minimum width position $W_{min}$ and the initial width $W_s$ have been measured, it will then be possible to determine the actual position of the pick up nozzle "O" relative to the center "G" of the component "K" both in the "X" and "Y" planes and also the angular relationship so as to determine the necessary correction factors in order to place the component "K" at the desired location and orientation on the substrate to which it is to be mounted.

Figure 14:
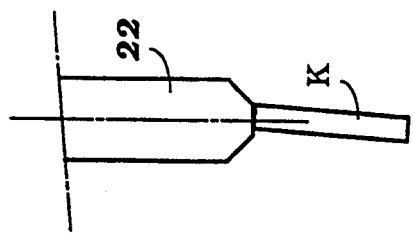
FIGS. 12 through 14 are side elevational views of the relationship of the pick up to the picked up component and show either a correct pick up (FIG. 12) or various forms that an incorrect pick up may take (FIGS. 13 and 14).
Figure 13:
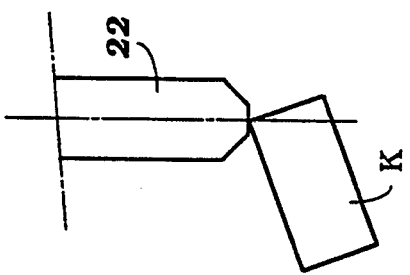
Figure 12:
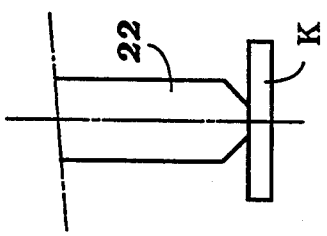

Before making these calculations, however, the program moves to Step 14 to determined if the component "K" has been appropriately attracted and is being held normally as shown in FIG. 12. It is possible that the component "K" could have been picked up in a misdirected orientation as shown in FIGS. 13 and 14 during the initial pick up. If at the Step 14 it is determined that the component "K" has not been appropriately pick up and is not in the orientation shown in FIG. 12, the program moves to the Step 15 to discard the picked up component. If, however, it has been determined at the Step 14 that the component "K" has been properly picked up, then the main processor 48 determines the necessary correction amounts "$X_c$, $Y_c$ and $\theta_c$" at the Step 16.

Figure 11:
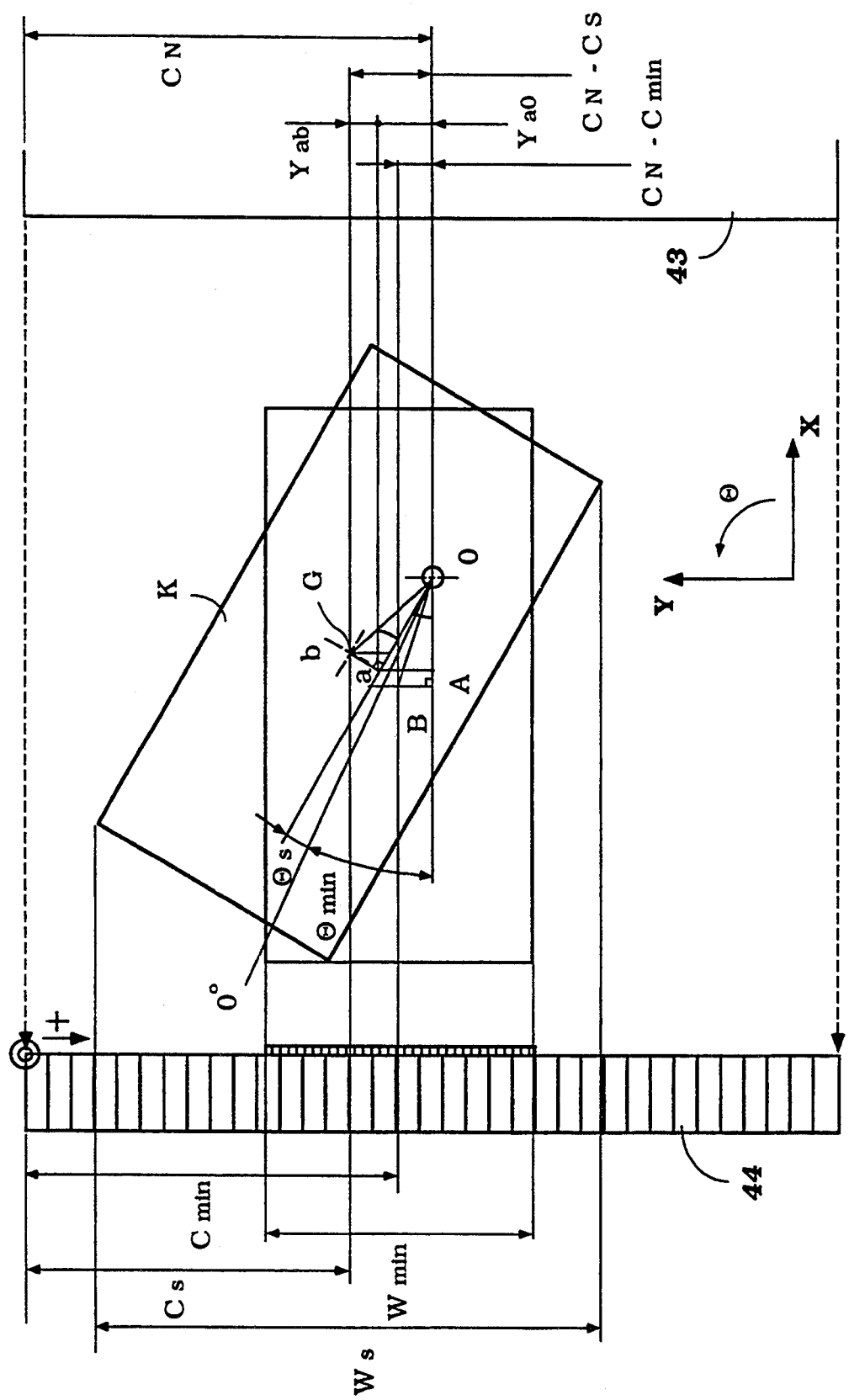
FIG. 11 is a further enlarged top plan view, in part similar to FIG. 8, and shows how the calculations for determining the correction factors are made.

These calculations may be best understood by reference to FIG. 11 which shows in solid line curves the $\theta_s$ position of the component "K" and its minimum width position. In this arrangement, the correction factors $Y_c$ and $\theta_c$ are easily determined in accordance with the following relationships:

$$Y_c = C_{min} - C_N$$

$$\theta_c = \theta_{min}$$

In these equations, $C_N$ is the center position of the attracting nozzle "O" as shown in FIG. 11 which is the distance from the edge of the measurement to the nozzle center which will be constant under all angular rotations of the component "K". Hence, $C_N$ is a known factor and thus $Y_c$ is easily calculated since $C_{min}$ is easily calculated. Hence, the correction amounts $Y_c$ and $\theta_c$ are values that are obtained substantially by actual measurement and no real calculation is required.

The value of $X_c$ however does require calculations using the date $C_s$, $\theta_s$, $C_{min}$ and $\theta_{min}$ obtained by the detected figures. The basis for these calculations are as follows and again reference is made to FIG. 11.

We know that $\triangle AOB = \triangle aOb$. Thus, a $b = AB = C_N - C_{min}$. Thus the projected length $W_{ab}$ of the side a b on the "Y" axis (the plane of measurement) can be determined from the following relationship:

$$Y_{ab} = (C_N - C_{min}) \cos(\theta_{min} + \theta_s)$$

Similarly the projected length $Y_{ao}$ of the side "a o" on the measurement plane of the "Y" axis is obtained by the following equation:

$$Y_{ao} = a\,o\sin(\theta_{min} + \theta_s)$$
$$= (C_N - C_s) - Y_{ab}$$
$$= (C_N - C_s) - (C_N - C_{min})\cos(\theta_{min} + \theta_s)$$

Therefore, the correction amount $X_c$ and the "X" axis direction can be calculated from the above equation by the following equation:

$$X_c = AO = a\,O$$
$$= \frac{(C_N - C_s) - (C_N - C_{min})\cos(\theta_{min} + \theta_s)}{\sin(\theta_{min} + \theta_s)}$$

Once the correction factors are determined, and it is to be understood that this measurement is done while the pick up head 21 is being moved toward the final mounting position, the component continues to move to its final corrected mounting position at the Step 17. This final mounting position is adjusted using the corrective factors $X_c$, $Y_c$ and $\theta_c$ determined as aforenoted and FIG. 6-4 shows the movement in the corrected $\theta_c$ position.

Figure 6:
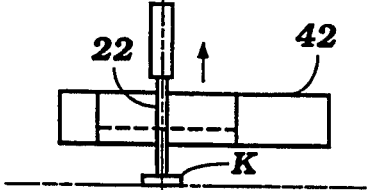
FIG. 6 is a series of views showing the vertical location of the apparatus and the rotary position of the component, respectively, at each of the locations 1 through 6 in FIG. 5.
Figure 7:
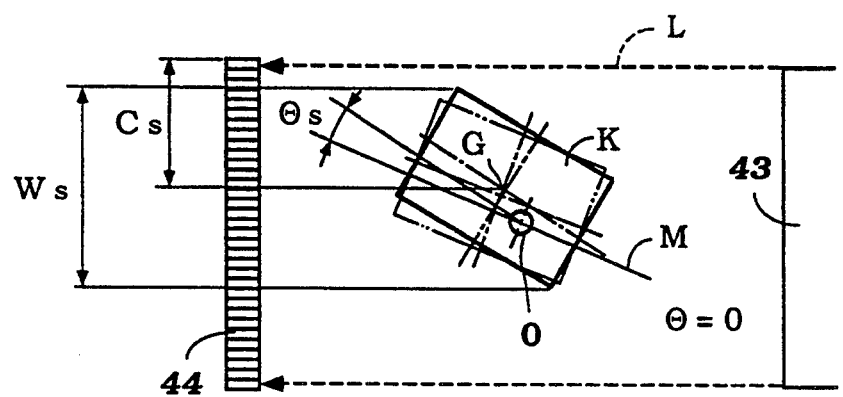
FIGS. 7 through 9 are top plan views, in part similar to the views 3 and 4 of FIG. 6 and shows the manner in which the measurements of projected length are obtained by the detecting apparatus.

The program then moves to the Step 18 to determine if the mounter head 21 and mounting component "K" is in the proper mounting position as shown at FIG. 6-5. If it is not, the program repeats. If, however, it is determined at the Step 18 that the mounting position is appropriately reached, then the "Z" axis servo motor 36 is energized so as to lower the pick up head 21 as shown also in FIG. 6-5 away from the detecting area 42.

At the Step 20 it is determined whether the pick up head 21 and specifically the component "K" has been lowered to the appropriate mounting position. If not, the program repeats. If, however, the pick up head 21 and component "K" have been lowered to the mounting position as show in FIG. 6-6, then the program moves to the Step 21 so as to discontinue the vacuum and deposit the piece "K" on the substrate.

Once the component "K" is released, the program moves to the Step 22 so as to elevate the pick up head 21 and pick up nozzle 22 so that the mounting operation is complete as the Step 23.

It should be readily apparent that the aforedescribed operation and apparatus permits very rapid mounting with minimum loss in time due to the fact that the correction amounts can be quickly calculated and also because of the fact that the correction measuring steps can be begun immediately after the unit begins to move upwardly so that the component "K" is clear of the pick up area and once the component "K" is in the sensing area 42. Of course, the foregoing description describes a mounting method wherein the minimum projected width or length $W_{min}$ of the component "K" is sensed. It is to be understood that the same method can be practiced by measuring the maximum projected width $W_{max}$ using very similar calculations.

In addition to the modifications mentioned, various other modifications may be made without departing from the spirit and scope of the invention, as defined by the appended claims.

We claim:

1. The method of determining the point where a component is picked up by a gripping device rotatable about an axis so that the component can be accurately placed by the gripping device, said method comprising the steps of measuring the projected length of the component in a plane parallel to the axis when the component is in a first angular position, rotating the component to second angular position, measuring the projected length of the component in its second position in said plane, measuring the angle of rotation of the component between the first and second positions, and calculating the place where by the component has been picked up from the length and angle measurements.

2. The method as set forth in claim 1 wherein the component is rotated to a second position wherein the projected length in the plane is at an extreme of the projected length in the plane.

3. The method as set forth in claim 2 wherein the projected length in the second position is the narrowest length.

4. The method as set forth in claim 2 wherein the projected length in the second position is the widest length.

5. The method as set forth in claim 1 wherein the components are picked up by the gripping device at a station wherein the components are only roughly oriented in a position.

6. The method as set forth in claim 5 wherein the method further comprises the steps of rotating the component to an initial angular position prior to the measurement.

7. The method as set forth in claim 6 wherein the initial rotation is in a direction opposite from the direction of rotation from the first position to the second position.

8. The method as set forth in claim 6 wherein the component is rotated to the initial position prior to the beginning of measurements and when the component is initially picked up.

9. The method as set forth in claim 1 wherein the offset of the center of the component from the center of the gripping device in the "X", "Y" planes and angular position about the rotational axis are calculated.

10. The method as set forth in claim 9 wherein the calculations are made by trigonometric relationships.

11. The method as set forth in claim 10 wherein the component is rotated to a second position wherein the projected length in the plane is at an extreme of the projected length in the plane.

12. The method as set forth in claim 11 wherein the projected length in the second position is the narrowest length.

13. The method as set forth in claim 11 wherein the projected length in the second position is the widest length.

14. The method as set forth in claim 13 wherein the components are picked up by the gripping device at a station wherein the components are only roughly oriented in a position.

15. The method as set forth in claim 14 wherein the method further comprises the steps of rotating the component to an initial angular position prior to the measurement.

16. The method as set forth in claim 15 wherein the initial rotation is in a direction opposite from the direction of rotation from the first position to the second position.

17. The method as set forth in claim 15 wherein the component is rotated to the initial position prior to the beginning of measurements and when the component is initially picked up.

18. The method as set forth in claim 1 further including the step of moving the gripping device between a position wherein a component is picked up and a position into registry with a sensing station wherein the measurements are performed.

19. The method as set forth in claim 18 wherein the sensing station is supported for movement along with the gripping device.

20. The method as set forth in claim 18 wherein the method further comprises the step of rotating the component to an initial angular position prior to the measurement.

21. The method as set forth in claim 20 wherein the initial rotation of the component is accomplished upon movement of the component between the pick up position and the sensing station.

22. The method as set forth in 21 wherein the sensing station is supported for movement along with the gripping device.

* * * * *